(12) United States Patent
Sato

(10) Patent No.: US 8,796,755 B2
(45) Date of Patent: Aug. 5, 2014

(54) NONVOLATILE SEMICONDUCTOR MEMORY DEVICE AND METHOD OF MANUFACTURING THE SAME

(71) Applicant: Kabushiki Kaisha Toshiba, Tokyo (JP)

(72) Inventor: Motoyuki Sato, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/750,399

(22) Filed: Jan. 25, 2013

(65) Prior Publication Data

US 2013/0341699 A1    Dec. 26, 2013

(30) Foreign Application Priority Data

Jun. 20, 2012  (JP) ................... 2012-139058

(51) Int. Cl.
    *H01L 29/792*  (2006.01)
(52) U.S. Cl.
    USPC ........... 257/324; 257/316; 257/321; 257/390; 257/E21.422; 438/257; 438/287; 438/593
(58) Field of Classification Search
    USPC .......... 257/314–324, 390, 411; 438/261, 287, 438/591; 365/185.17, 185.33
    See application file for complete search history.

(56) References Cited

U.S. PATENT DOCUMENTS

| 8,053,311 | B2 | 11/2011 | Nakagawa et al. |
| 8,058,681 | B2 * | 11/2011 | Shingu et al. ................. 257/324 |
| 8,294,195 | B2 * | 10/2012 | Shingu et al. ................. 257/316 |
| 2010/0244192 | A1 | 9/2010 | Nakagawa et al. |
| 2012/0007163 | A1 | 1/2012 | Akahori et al. |

FOREIGN PATENT DOCUMENTS

| JP | 2008-235358 A | 10/2008 |
| JP | 2009-164624 A | 7/2009 |
| JP | 2012-19020 A | 1/2012 |
| WO | WO 2010/050291 A1 | 5/2010 |

OTHER PUBLICATIONS

S. Migita et al.:"Design and Demonstration of Very High-k (k-50) HfO$_2$ for Ultra-Scaled Si CMOS": 2008 Symposium on VLSI Technology Digest of Technical Papers: pp. 152-153 (in English).

* cited by examiner

*Primary Examiner* — Dung A. Le

(74) *Attorney, Agent, or Firm* — Holtz Holtz Goodman & Chick PC

(57) ABSTRACT

According to one embodiment, a nonvolatile semiconductor memory device includes a first insulating layer on a semiconductor layer, a charge storage layer on the first insulating layer, a second insulating layer on the charge storage layer, and a control gate electrode on the second insulating layer. The charge storage layer includes a floating gate layer on the first insulating layer, an interface insulating layer on the floating gate layer, a first charge trap layer on the interface insulating layer, and a second charge trap layer on the first charge trap layer, and a trap level of the second charge trap layer is lower than a trap level of the first charge trap layer.

20 Claims, 14 Drawing Sheets

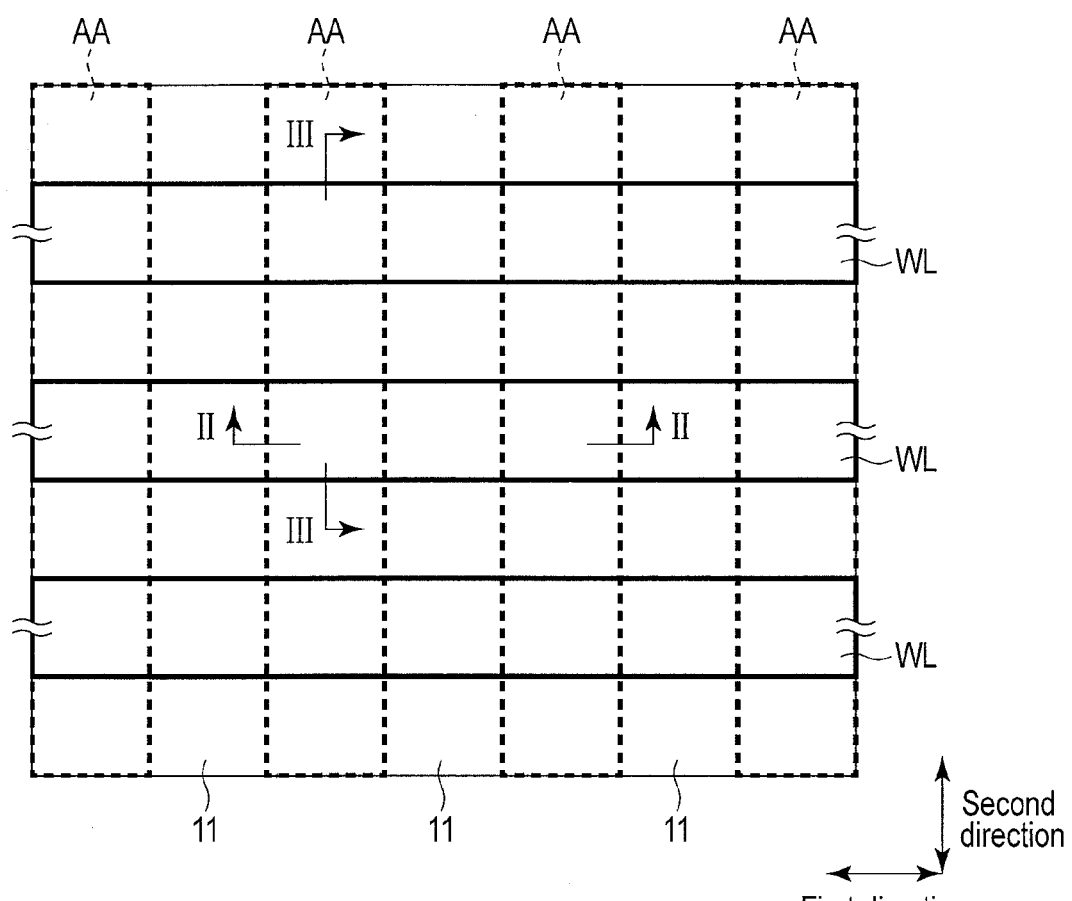
F I G. 1

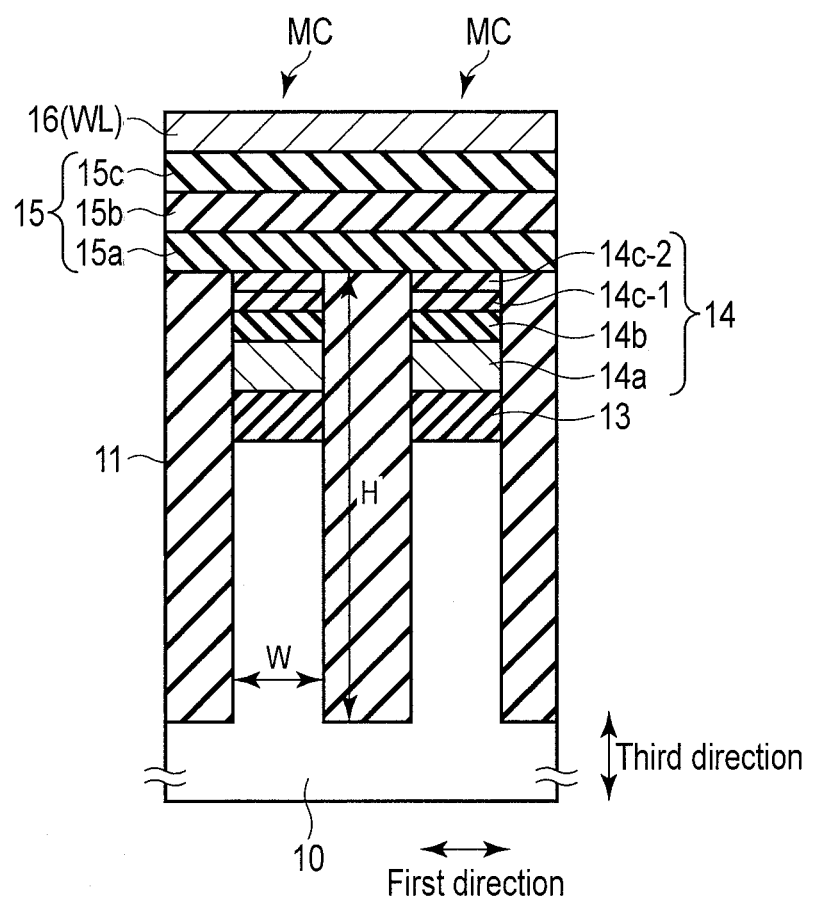
F I G. 2

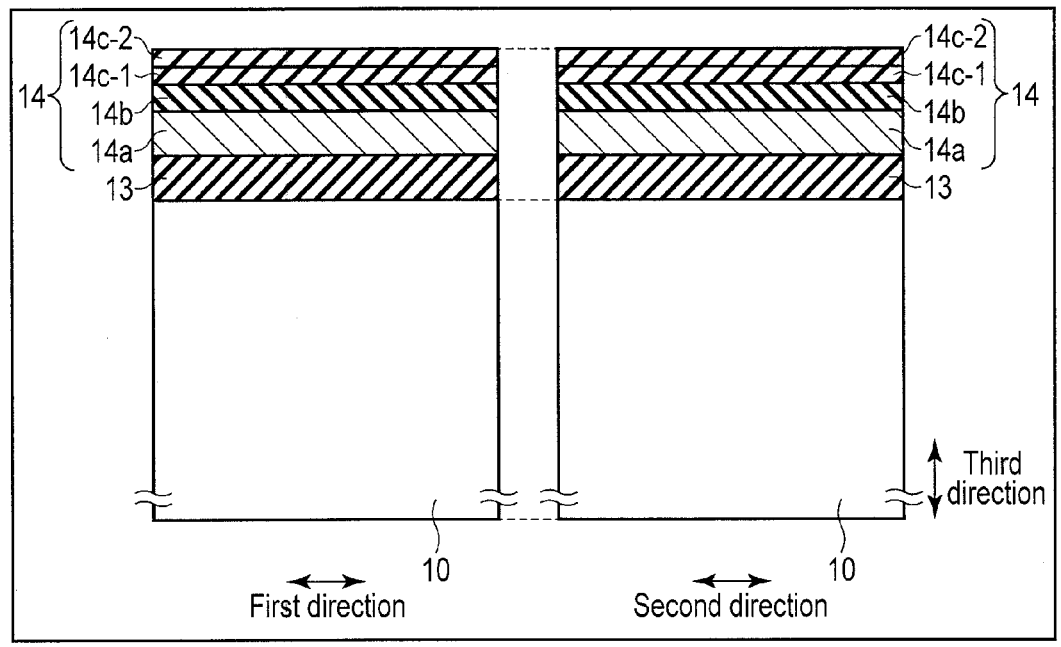
F I G. 11
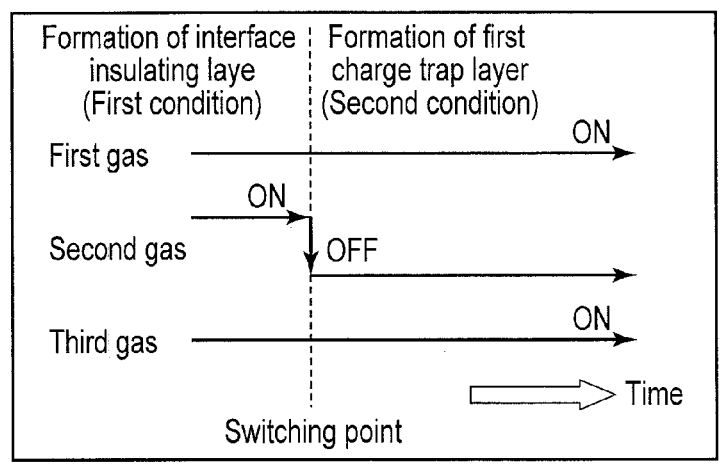
F I G. 12

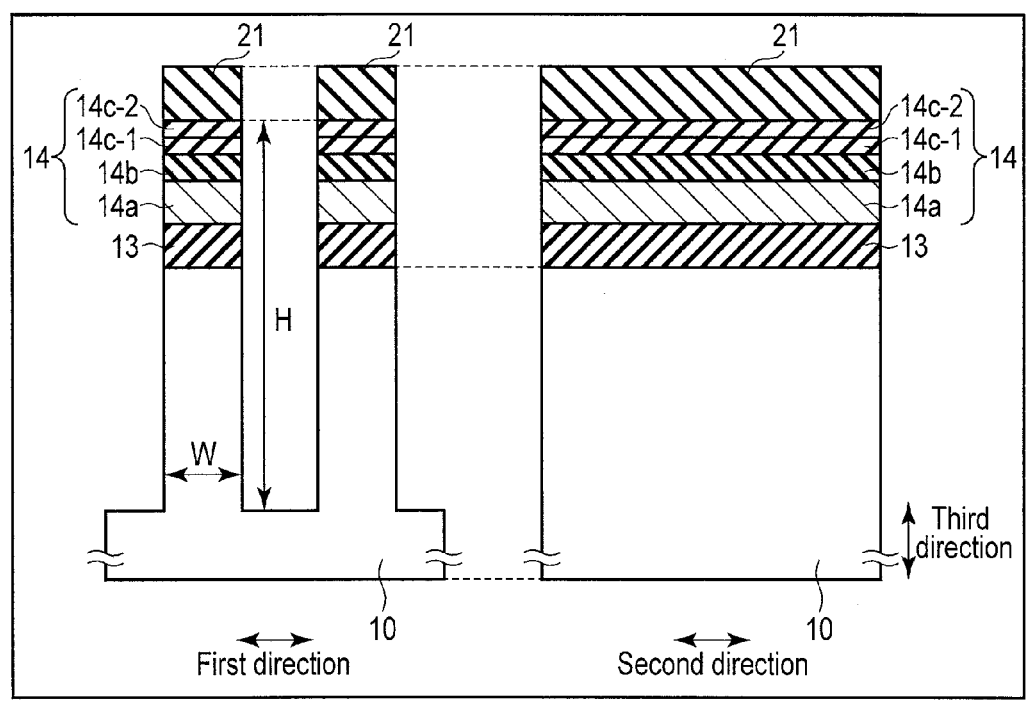
F I G. 15

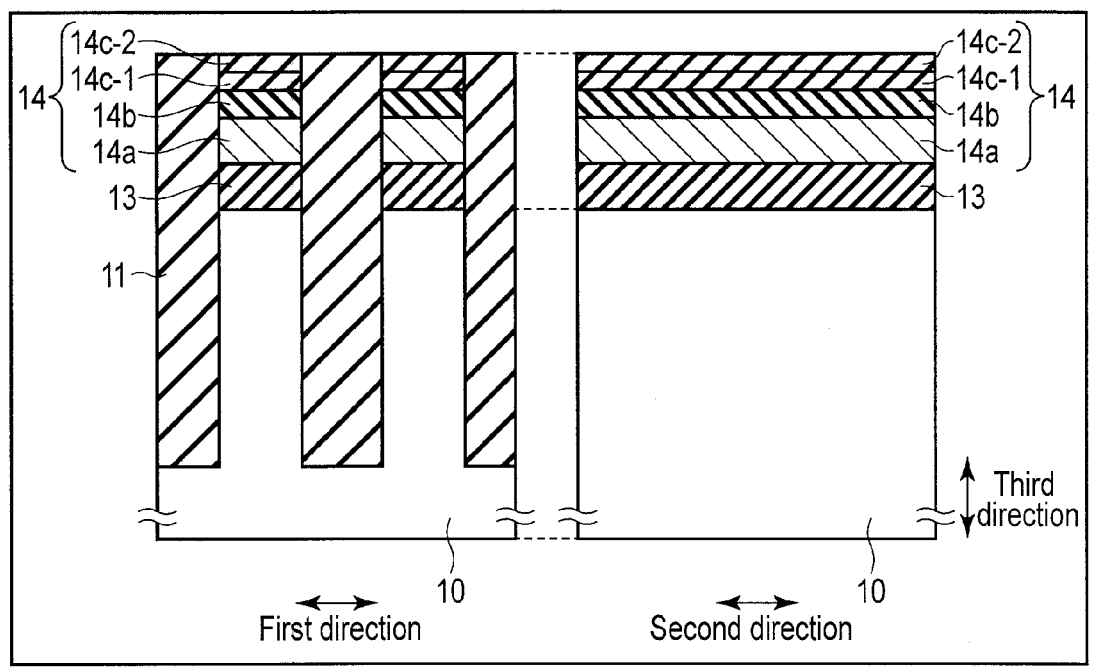
F I G. 16

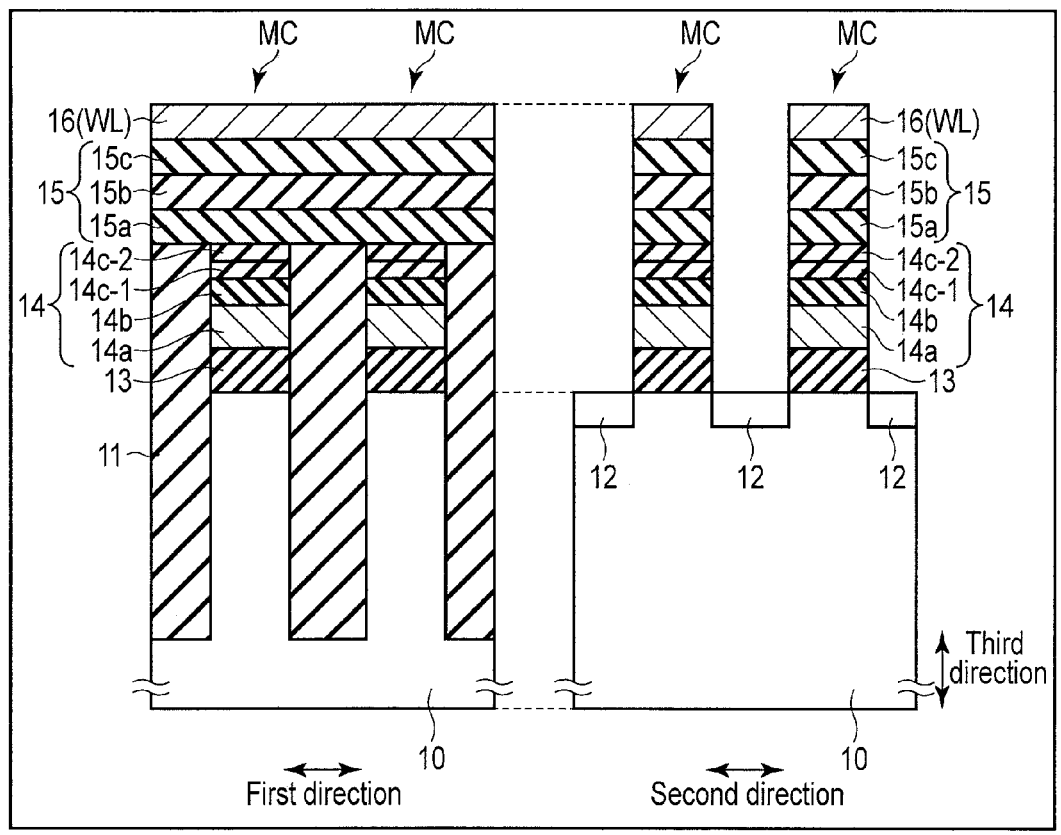
F I G. 18

NONVOLATILE SEMICONDUCTOR MEMORY DEVICE AND METHOD OF MANUFACTURING THE SAME

CROSS-REFERENCE TO RELATED APPLICATIONS

This application is based upon and claims the benefit of priority from Japanese Patent Application No. 2012-139058, filed Jun. 20, 2012, the entire contents of which are incorporated herein by reference.

FIELD

Embodiments described herein relate generally to a nonvolatile semiconductor memory device and a method of manufacturing the same.

BACKGROUND

In a method of manufacturing a nonvolatile semiconductor memory device, such as a flash memory, there is a step of processing a memory cell area into a fin shape temporarily. With the progress of miniaturization of memory cells, the aspect ratio of a fin-shaped memory cell area in this step is getting higher, causing the problem of, for example, the fin-shaped memory cell area collapsing.

To solve this problem, efforts have been directed toward developing a hybrid structure where a charge storage layer of a memory cell has a floating gate layer and a charge trap layer stacked one on top of the other. The hybrid structure can suppress the height of the charge storage layer and therefore attracts attention as the technique for decreasing the aspect ratio of a fin-shaped memory cell area in a manufacturing process.

However, in a memory cell with the hybrid structure, the threshold voltage of the memory cell after it is written into varies significantly and therefore erroneous reading is liable to take place due to a decrease in the read margin.

BRIEF DESCRIPTION OF THE DRAWINGS

FIG. 1 is a plan view of memory cells of an embodiment;
FIG. 2 is a sectional view along line II-II of FIG. 1;
FIG. 11 is a sectional view showing the method of manufacturing the memory cell of the embodiment;
FIG. 12 is a diagram showing a method of forming an interface insulating layer and a charge trap layer consecutively;
FIG. 15 is a sectional diagram showing a method of manufacturing a memory cell of the embodiment;
FIG. 16 is a sectional diagram showing the method of manufacturing the memory cell of the embodiment;
FIG. 18 is a sectional diagram showing a method of manufacturing the memory cell of the embodiment.

DETAILED DESCRIPTION

Figure 3:
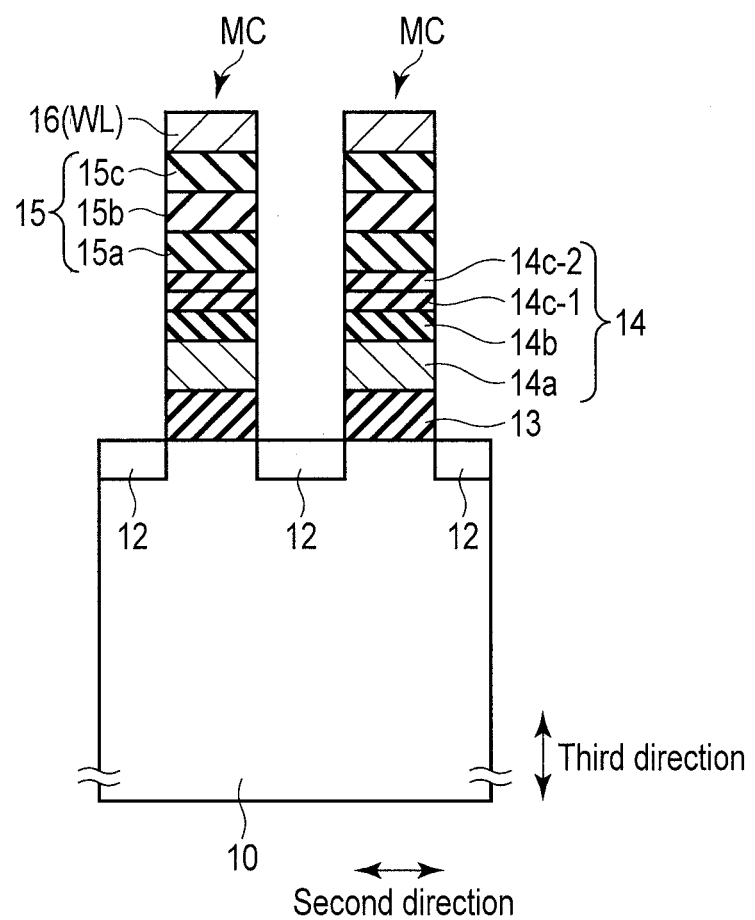
FIG. 3 is a sectional view along line III-III of FIG. 1.

In general, according to one embodiment, a nonvolatile semiconductor memory device comprising: a semiconductor layer; a first insulating layer on the semiconductor layer; a charge storage layer on the first insulating layer; a second insulating layer on the charge storage layer; and a control gate electrode on the second insulating layer, wherein the charge storage layer includes a floating gate layer on the first insulating layer, an interface insulating layer on the floating gate layer, a first charge trap layer on the interface insulating layer, and a second charge trap layer on the first charge trap layer, and a trap level of the second charge trap layer is lower than a trap level of the first charge trap layer.

Hereinafter, referring to the accompanying drawings, an embodiment will be explained.

First, a hybrid structure on which a memory cell of the embodiment is based will be explained.

A memory cell with a hybrid structure is characterized in that a charge storage layer has a stacked layer of a floating gate layer with a conducting layer in an electrically floating state and a charge trap layer including an insulating layer with the function of locally trapping charges.

Furthermore, in the hybrid structure, the floating gate layer is arranged on the tunnel barrier layer side and the charge trap layer is arranged on the block insulating layer side. Then, the floating gate layer is caused to function as a buffer layer for causing the charge trap layer on the block insulating layer side to store more charges.

In addition, the hybrid structure is further characterized in that an interface insulating layer for preventing charges stored in the charge trap layer from leaking into the floating gate layer is arranged between the floating gate layer and the charge trap layer.

With such a hybrid structure, for example, even if a memory cell area has been processed into a fin shape temporarily during a manufacturing process in, for example, a flat cell structure where the top face of an element isolation insulating film is almost the same as the top face of the charge storage layer, the aspect ratio of the memory cell area can be decreased. Therefore, the collapse of the fin-shaped memory cell area can be prevented.

However, in a conventional hybrid structure, the threshold voltage of a memory cell written into is liable to vary and therefore the chances are high that erroneous reading will be performed due to a decrease in the read margin.

Therefore, the reason why such a variation in the threshold voltage takes place has been checked. Then, it has become clear that the reason is that charges trapped in the charge trap layer leak into the floating gate layer by way of the interface insulating layer.

The interface insulating layer is generally composed of a material whose conduction band lower end is higher than the conduction band lower end of the charge trap layer, for example, a silicon nitride layer (e.g., SiN) to prevent charges stored in the charge trap layer from leaking easily into the floating gate layer.

However, when a silicon nitride layer has been used as the interface insulating layer, charged stored in the charge trap layer leak easily into the floating gate layer because the silicon nitride layer has the property of trapping charges. This means that the original purpose of providing the interface insulating layer cannot be realized and therefore contributes to a variation in the threshold voltage.

In addition, particularly when a memory cell has a flat cell structure, the facing area (capacitor capacity) between the charge storage layer and a control gate electrode is small and therefore a high coupling ratio cannot be obtained, making it difficult to trap sufficient charges in the charge trap layer. As a result, the shift ΔVth of the threshold voltage caused by the trapping of a charge in the charge trap layer and the shift ΔVth of the threshold voltage caused by the escape of a charge from the charge trap layer become larger, which makes noticeable a variation in the threshold voltage in the flat cell structure.

In the embodiment below, the structure and material of a charge trap layer required to suppress a variation in the threshold voltage of a memory cell and sharpen a threshold voltage distribution will be explained.

The charges trapped in the charge trap layer are less liable to escape into the floating gate layer. In addition, in the flat cell structure, too, to trap more charges in the charge trap layer with a high coupling ratio, charges is stored in an area as near a block insulating layer as possible in the charge trap layer.

The reason for this is that the capacitor capacity for the control gate electrode viewed from the charges trapped in the charge storage layer becomes higher, increasing the coupling ratio, which makes it possible to store more charges in a part closer to the block insulating layer in the charge trap layer. In addition, since charges have been trapped in a part closer to the block insulting layer in the charge trap layer, the trapped charges are less liable to escape into the floating gate via the interface insulating layer.

Therefore, a variation in the threshold voltage of the memory cell is suppressed and the threshold voltage distribution becomes sharp, increasing a read margin, which makes erroneous reading less liable to be performed.

As described above, to trap charges in an area closer to the block insulating layer in the charge trap layer, the charge trap layer is configured to have a two-layer structure in the embodiment.

For example, the charge trap layer has a first charge trap layer with a first trap level and a second charge trap layer with a second trap level lower than the first trap level. The first charge trap layer is located on the interface insulating layer side and the second charge trap layer is located on the block insulating layer side.

With such a two-layer structure, since the trap level gets deeper (or lower) as the control gate electrode approaches, more charges can be trapped in an area closer to the block insulating layer.

[Structure]

FIG. 1 shows memory cells in a memory cell array constituting a nonvolatile semiconductor memory device. FIG. 2 is a sectional view taken along line II-II of FIG. 1. FIG. 3 is a sectional view taken along line III-III of FIG. 1.

While in the embodiment, a flat cell structure where the top face of an element isolation insulating film 11 is almost the same as the top face of a charge storage layer 14, the structure of a memory cell MC is not limited to this. In addition, the memory cell MC may have either a two-dimensional structure or a three-dimensional structure.

Furthermore, the memory cell MC may be a two-level memory that stores two-level data (one-bit data) or a multi-level memory that stores data not less than four-level data (two-bit data) according to the shift ΔVth of the charge storage layer 14.

A semiconductor layer (e.g., a semiconductor substrate) 10 is, for example, a silicon layer. An element isolation insulating layer 11, which is, for example, a shallow trench isolation (STI), is arranged in a first direction and extends in a second direction. The element isolation insulating layer 11, which is, for example, a silicon oxide layer, fills a trench made in a surface in a third direction of the semiconductor layer 10.

An active area AA is a semiconductor layer 10 sandwiched between element isolation insulating layers 11. Like the element isolation insulating layer 11, the active area AA is arranged in the first direction and extends in the second direction.

On the semiconductor layer 10 in the active area AA, for example, a plurality of memory cells MCs connected in series are arranged. While in the embodiment, the memory cell array has a NAND structure, it is not restricted to this.

Each of the memory cells MCs includes a plurality of source/drain regions 12 arranged at the surface of the semiconductor layer 10, gate insulating layers (tunnel insulating layers) 13 arranged on the channel regions between the source/drain regions 12, charge storage layers 14 arranged on the gate insulating layers 13, block insulating layers 15 arranged on the charge storage layers 14, and control gate electrodes 16 arranged on the block insulating layers 15.

A control gate electrode 16 extends in the first direction and functions as a word line WL.

While in the embodiment, a memory cell MC has a source/drain region 12, the region 12 may be omitted. The reason is that a shortened distance between the memory cells MCs connected in series enables a conduction path passing through the channel regions of memory cells MCs to be produced by a so-called fringe effect even if there is no source/drain region 12.

The charge storage layer 14 includes a floating gate layer 14a arranged on the gate insulating layer 13, an interface insulating layer 14b arranged on the floating gate layer 14a, a first charge trap layer 14c-1 arranged on the interface insulating layer 14b, and a second charge trap layer 14c-2 arranged on the first charge trap layer 14c-1.

In the case of a hybrid structure, the floating gate layer 14a plays an auxiliary role to cause carriers to be trapped and held easily in the first and second charge trap layers 14c-1, 14c-2.

In the embodiment, to suppress a variation in the threshold voltage of a memory cell after the cell is written into, the first and second charge trap layers 14c-1, 14c-2 comprise materials satisfying the following conditions respectively.

The trap level of the second charge trap layer 14c-2 is lower than the trap level of the first charge trap layer 14c-1.

For example, when the first and second charge trap layers 14c-1, 14c-2 are the same in main composition (e.g., both include $HfO_2$), the first charge trap layer 14c-1 has a monoclinic crystal structure and the second charge trap layer 14c-2 has a cubic crystal structure or an orthorhombic structure to fulfill such conditions.

Here, suppose that the first and second charge trap layers 14c-1, 14c-2 are the same in main composition means that the constituent elements of the first and second charge trap layers 14c-1, 14c-2 are the same and the constituent elements of the second charge trap layer 14c-2 include all the constituent elements of the first charge trap layer 14c-1 and further include elements (impurities) excluding the constituent elements of the first charge trap layer 14c-1.

When the first charge trap layer 14c-1 comprises $HfO_2$, $HfO_2$ is generally in a stable state in a monoclinic crystal structure. That is, to cause the second charge trap layer 14c-2 to have a cubic crystal structure, some creative thinking is required.

This will be described in detail in explaining a manufacturing method.

In the embodiment, the memory cells have a flat cell structure. Specifically, the top face of an element isolation insulating film 11 is almost the same as the top face of the charge storage layer 14 and the base of the block insulating layer 15 is flat.

It is known that, in the flat cell structure, before an element isolation insulating layer 11 is formed, a memory cell area is processed into a fin shape temporarily and the aspect ratio (H/W) of the memory cell area becomes higher as the miniaturization progresses.

However, with the embodiment, the height (the width in a third direction) of the charge storage layer 14 can be made lower due to the effect of suppressing a variation in the threshold voltage of the memory cell. Therefore, an increase in the aspect ratio of the memory cell area can be suppressed, preventing the fin-shaped memory cell area from collapsing in the middle of a manufacturing process.

The block insulating layer 15, which has a stacked-layer structure, includes the first to third layers. The first layer 15a is an insulating layer with a high potential barrier for preventing a leak in a write operation. The first layer 15a has, for example, a silicon oxide layer ($SiO_2$). The second layer 15b is an insulating layer with a high permittivity for improving the coupling ratio of a memory cell MC. The second layer 15b has, for example, a hafnium oxide layer ($HfO_2$). The third layer 15c is a buffer layer for preventing the second layer 15b and the control gate electrode 16 from reacting with each other. The third layer 15c has, for example, a tantalum oxide layer (TaO).

While in the embodiment, the block insulating layer 15 has a three-layer structure, it is not limited to this. For example, the block insulating layer 15 may be a single layer. In addition, an interface layer may be provided at least either between the charge storage layer 14 and the block insulating layer 15 or between the block insulating layer 15 and the control gate electrode 16.

Figure 4:
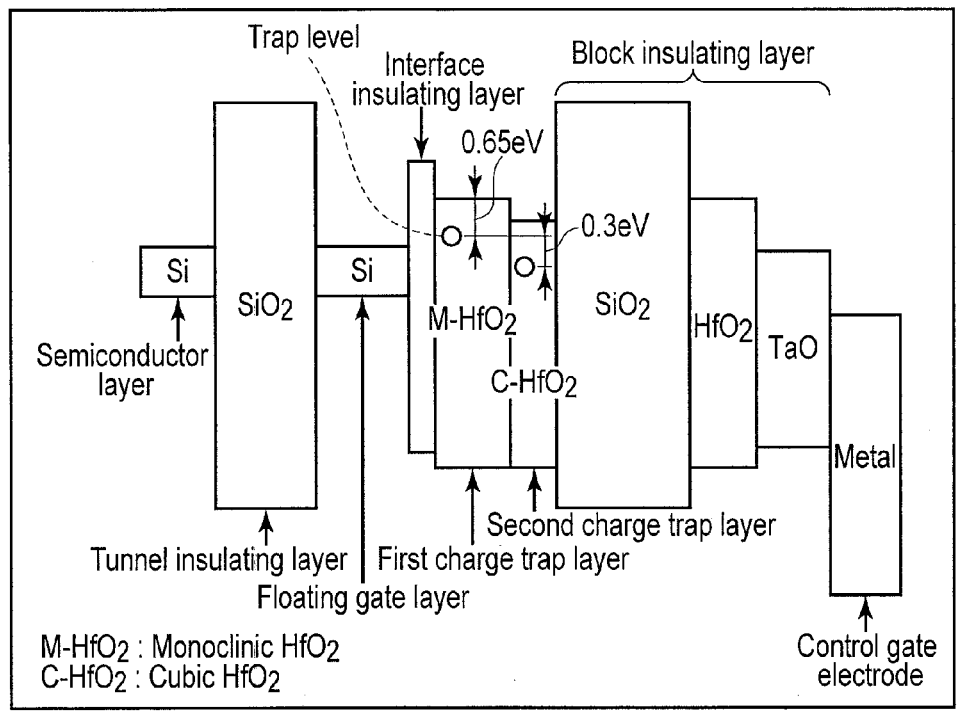
FIG. 4 is an energy band diagram of a memory cell of the embodiment.

FIG. 4 is an energy band diagram of a memory cell according to the embodiment.

In FIG. 4, energy is represented in a vertical direction and the position of each layer is represented in a horizontal direction. The names in FIG. 4 correspond to the names in the structures of FIGS. 1 to 3.

In the embodiment, the semiconductor layer comprises Si, the tunnel insulating layer comprises $SiO_2$, the interface insulating layer comprises SiN, the first charge trap layer has a monoclinic crystal structure of $HfO_2$, the second charge trap layer has a cubic crystal structure of $HfO_2$, the block insulating layer has a stacked layer of $SiO_2$/$HfO_2$/Tao, and the control gate electrode comprises metal.

The first charge trap layer has a charge trap level in a position about 0.65 eV lower than the lower end of the conduction band. The second charge trap layer has a charge trap level in a position about 0.3 eV lower than the trap level of the first charge trap layer.

With such a band structure, the trap level of the second charge trap layer close to the block insulating layer is lower than the trap level of the first charge trap layer. In a write operation, more charges are trapped in the second charge trap layer. Therefore, variation in the threshold voltage can be suppressed.

As a result of charges being trapped in the second charge trap layer whose trap level is deeper, the trapping effect of charges in the second charge trap layer becomes greater, improving the data retention characteristic.

Figure 5:
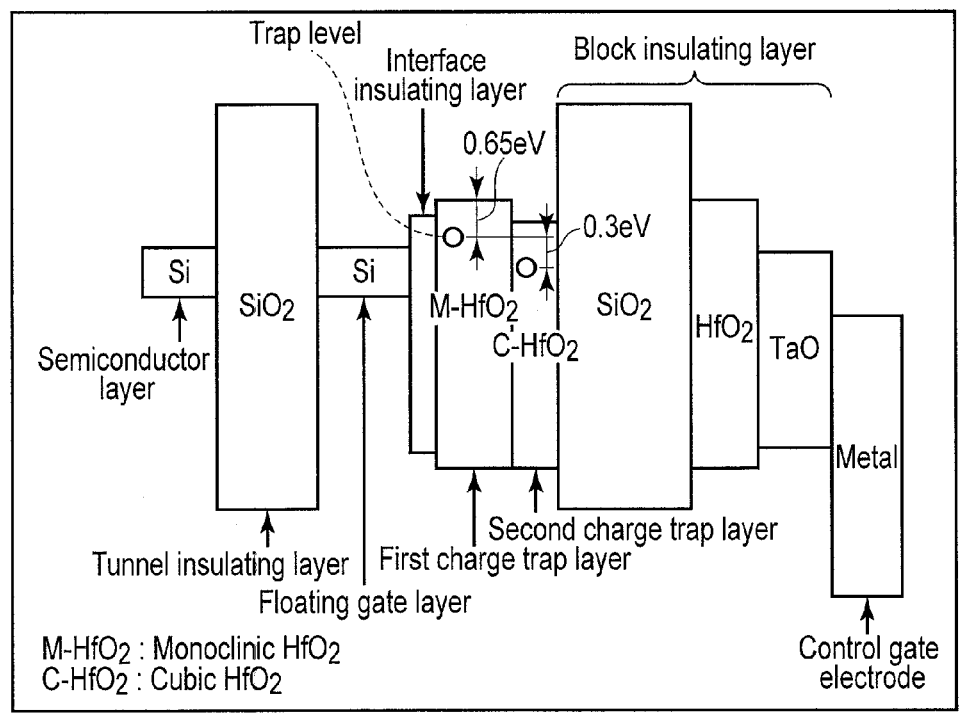
FIG. 5 is an energy band diagram of a memory cell of the embodiment.

FIG. 5 is an energy band diagram of a memory cell according to the embodiment.

This band diagram differs from that of FIG. 4 in the band structure of the interface insulating layer. The band structure of FIG. 5 is the same as that of FIG. 4 for the rest.

The embodiment is characterized in that the interface insulating layer comprises a material that satisfies the following conditions to improve the write characteristic and the data retention characteristic:

The lower end of the conduction band is higher than the trap level of the first charge trap layer.

The lower end of the conduction band is lower than the trap level of the first charge trap layer.

The interface insulating layer does not have the property of trapping charges.

In the band structure of FIG. 4, the conduction band lower end of the interface insulating layer is higher than the conduction band lower end of the first charge trap layer. For example, when the first charge trap layer has a monoclinic crystal structure of $HfO_2$, the interface insulting layer comprises SiN.

In contrast, with the band structure of FIG. 5, the conduction band lower end of the interface insulating layer is lower than the conduction band lower end of the first charge trap layer to improve the write characteristic. By doing this, the potential barrier against carries moving from the floating gate (e.g., Si) to the first charge trap layer is alleviated, improving the write characteristic.

In addition, to improve the data retention characteristic, the conduction band lower end of the interface insulating layer is higher than the trap level of the first charge trap layer. That is, to prevent carries trapped in the first and second charge trap layers from escaping into the floating gate layer, the conduction band lower end of the interface insulating layer is higher than the trap level of the first charge trap layer.

By doing this, the band structure of FIG. 5 makes it possible to suppress a variation in the threshold distribution of a memory cell and realize improvements in the write characteristic and data retention characteristic.

As a material for the interface insulating layer that satisfies such a condition, a material obtained by adding alkali metal (e.g., Mg) or lanthanoid-based material (e.g., La or Y) to a material ($HfO_2$) of which the charge trap layer is made can be enumerated when the charge trap layer comprises $HfO_2$.

The composition ratio of the materials constituting the first charge trap layer, the second charge trap layer, and the interface insulating layer is not limited to the above example. For example, the composition ratio may be changed suitably, provided that the first charge trap layer, the second charge trap layer, and the interface insulating layer maintain a stable state.

Figure 6:
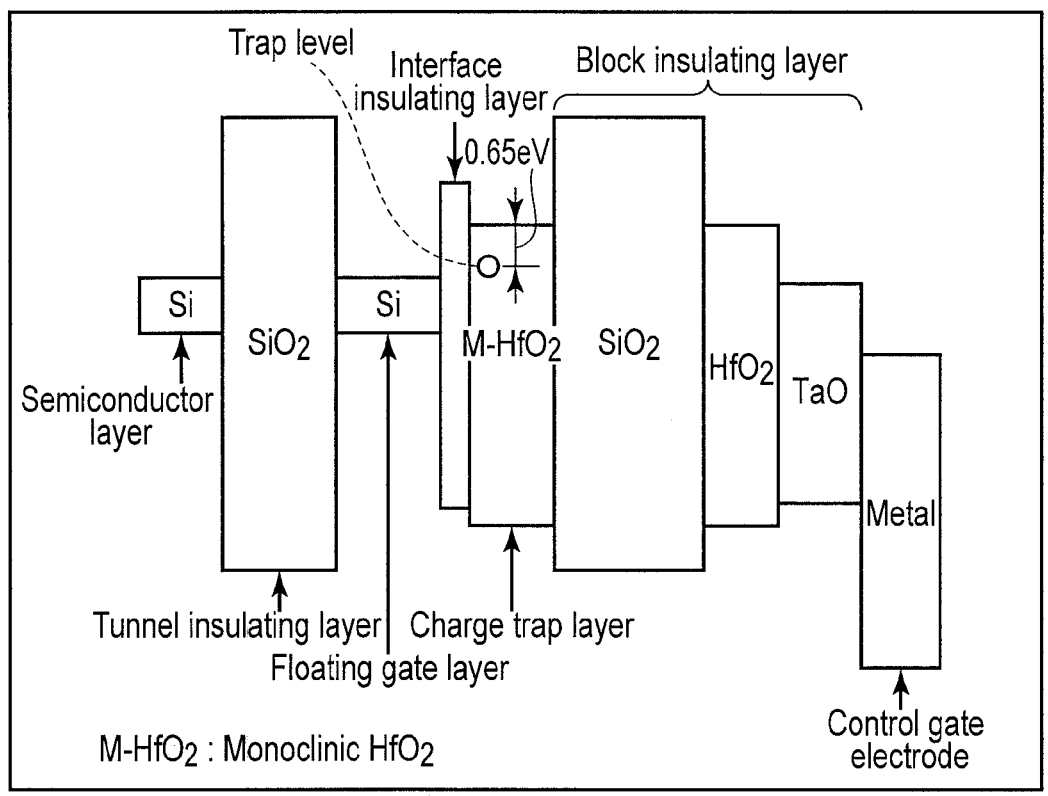
FIG. 6 is an energy band diagram of a memory cell of a comparative example.

FIG. 6 is an energy band diagram of a memory cell of a comparative example.

In FIG. 6, energy is represented in a vertical direction and the position of each layer is represented in a horizontal direction.

The comparative example of FIG. 6 is the same as that of FIG. 4, except that the charge trap layer is a multilayer or a single layer.

That is, they differ only in the charge trap layer, provided that the semiconductor layers, tunnel insulating layers, floating gate layers, interface insulating layers, block insulating layers, and control gate electrodes are configured using the same structure and the same materials.

Figure 7:
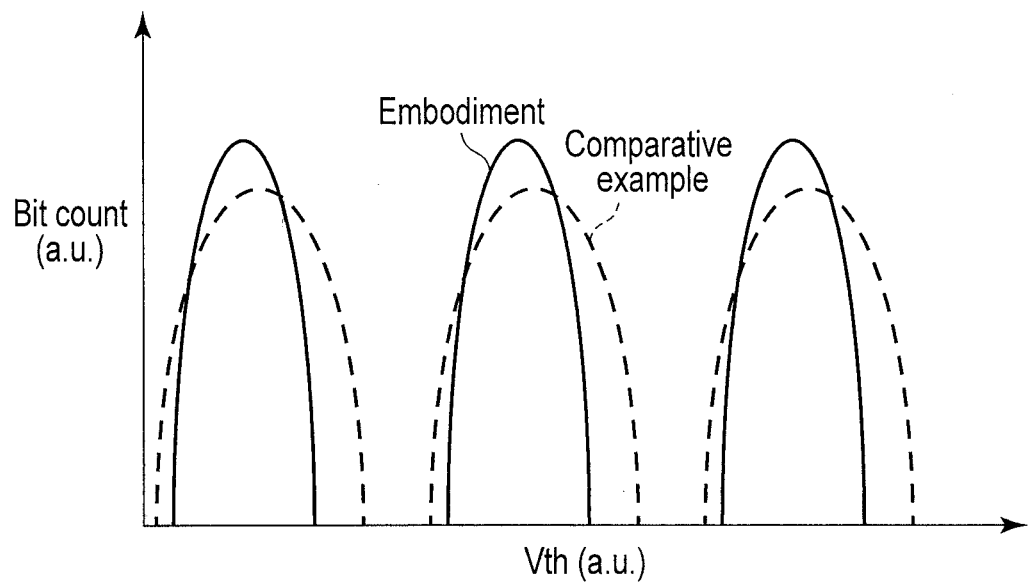
FIG. 7 is a characteristic diagram showing a threshold distribution of a memory cell.

FIG. 7 is a diagram where the threshold distribution in the embodiment of FIG. 4 is compared with that in the comparative example of FIG. 6.

In FIG. 7, a solid line represents the embodiment of FIG. 4 and a broken line represents the comparative example of FIG. 6. The horizontal axis indicates a write threshold voltage Vth and the vertical axis indicates a bit count.

With the embodiment, a variation in the threshold distribution after a write operation can be suppressed and the threshold distribution can be made sharp as compared with the comparative example. Therefore, a margin for reading can be secured sufficiently, enabling erroneous reading to be prevented.

Figure 8:
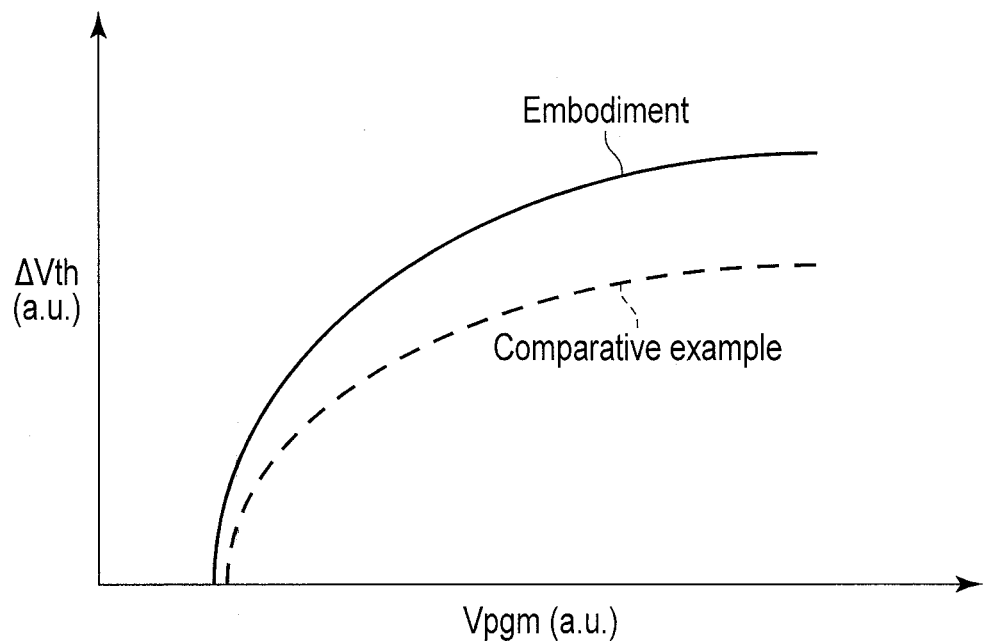
FIG. 8 is a characteristic diagram showing a write characteristic.

FIG. 8 is a diagram where the write characteristic in the embodiment of FIG. 5 is compared with that in the comparative example of FIG. 6.

In FIG. 8, the write characteristic of the memory cell is represented as the relationship between a write voltage Vpgm and a shift ΔVth of the threshold voltage.

From FIG. 8, it can be understood easily that the shift ΔVth of the threshold voltage of the embodiment is larger than the shift ΔVth of the threshold voltage of the comparative example when the write voltage is the same.

That is, this means that, when writing is done under the same condition, the memory cell of the embodiment can trap more charges in the charge trap layer than that of the comparative example.

As described above, according to the embodiment, the write characteristic can be improved.

Figure 9:
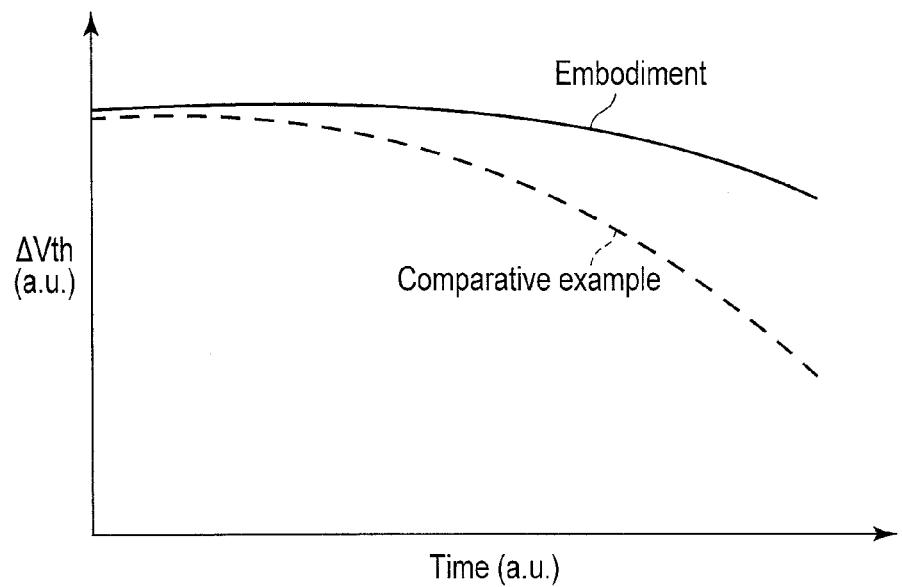
FIG. 9 is a characteristic diagram showing a data retention characteristic.

FIG. 9 is a diagram where the data retention characteristic in the embodiment of FIG. 5 is compared with that in the comparative example of FIG. 6.

In FIG. 9, the data retention characteristic of the memory cell is represented as the relationship between an elapsed time (Time) immediately after writing was done and the shift ΔVth of the threshold voltage.

From FIG. 9, it can be understood easily that the shift ΔVth of the threshold voltage of the embodiment is smaller than the shift ΔVth of the threshold voltage of the comparative example when it has been assumed that the threshold voltage of the memory cell immediately after writing was done is the same.

That is, this means that, when the memory cell of the embodiment and that of the comparative example have been placed in the same environment immediately after writing was done, the memory cell of the embodiment can trap more charges in the charge trap layer than that of the comparative example.

As described above, according to the embodiment, the data retention characteristic can be improved.

[Manufacturing Method]

A method of manufacturing a nonvolatile semiconductor memory device of FIGS. 1 to 3 will be explained.

FIGS. 10 to 18 show a method of manufacturing a nonvolatile semiconductor memory device of FIGS. 1 to 3.

In FIGS. 10 to 18, a first, a second, and a third direction correspond to the first, second, and third directions in FIGS. 1 to 3. The first and second directions, which are in parallel with the surface of a semiconductor layer 10 as a semiconductor substrate, cross each other at right angles. The third direction is in a direction perpendicular to the surface of the semiconductor layer 10 as, for example, a semiconductor substrate.

In addition, the first direction is in a direction in which, for example, a control gate electrode (word line) extends and in parallel with the channel width of a cell transistor (FET: Field Effect Transistor) as a memory cell. The second direction is in a direction in which, for example, a bit line extends and is in parallel with the channel length of a cell transistor as a memory cell.

In FIGS. 10 to 18, the same elements as those in FIGS. 1 to 3 are indicated by the same reference symbols, thereby clarifying the correspondence relationship between the structure of FIGS. 1 to 3 and the manufacturing method of FIGS. 10 to 18.

Figure 10:
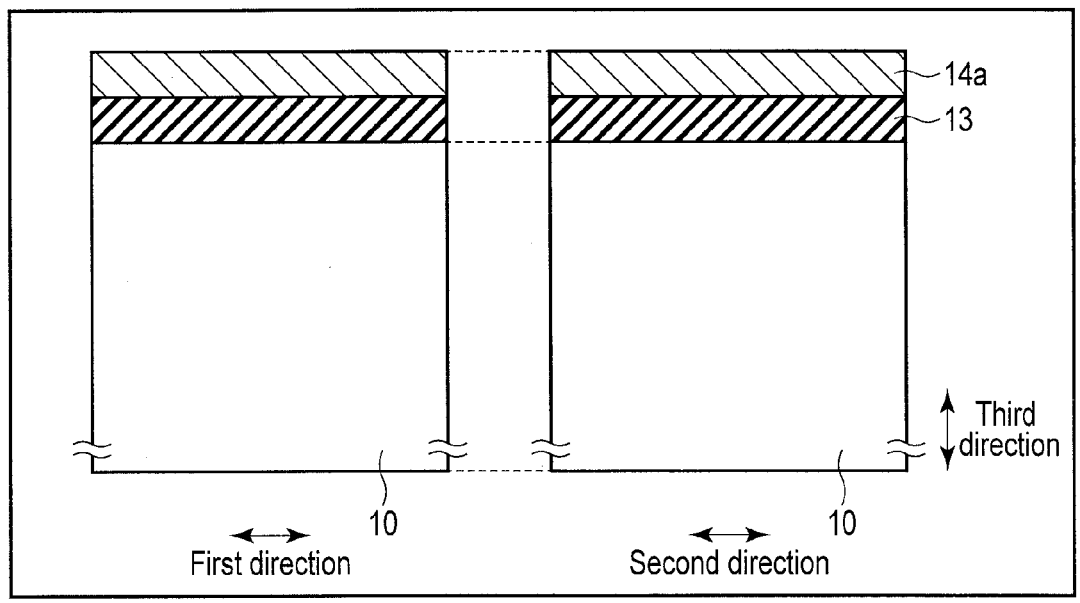
FIG. 10 is a sectional view showing a method of manufacturing a memory cell of the embodiment.

First, as shown in FIG. 10, a gate insulating layer (e.g., a silicon oxide layer) 13 is formed on a semiconductor layer 10 by, for example, a thermal oxidation method. Then, a floating gate layer (e.g., conductive polysilicon layer) 14a is formed on the gate insulating layer 13 by, for example, CVD or ALD techniques.

Next, as shown in FIG. 11, on the floating gate layer 14a, an interface insulating layer 14b, a first charge trap layer 14c-1, and a second charge trap layer 14c-2 are formed.

To realize, for example, the band structure of FIG. 5, the interface insulating layer 14b comprises a material obtained by adding one of alkali metal and lanthanoid-based material to a material of which the first charge trap layer 14c-1 is made. In this case, the interface insulating layer 14b and the first charge trap layer 14c-1 can be formed consecutively in the same chamber.

For example, as shown in FIG. 12, the interface insulating layer 14b is formed in an atmosphere that includes a first gas (a gas including Hf), a second gas (a gas including one of alkali metal and lanthanoid-based material), and a third gas (a gas including oxygen, such as $H_2O$ or $O^3$) as a first condition.

The first charge trap layer 14c-1 is formed in an atmosphere that includes the first and third gases but does not include the second gas as a second condition.

In this case, the interface insulating layer 14b and the first charge trap layer 14c-1 can be formed consecutively by switching between the first and second conditions in the same chamber.

To switch between the first and second conditions, the supply of the second gas is simply stopped after the formation of the interface insulating layer 14b.

For example, after the interface insulating layer 14b has been formed by CVD, ALD, or PVD techniques in an atmosphere including the first, second, and third gases, only the second gas is stopped and the first charge trap layer 14c-1 can continue to be formed.

As for the formation of the interface insulating layer 14b and the first charge trap layer 14c-1, it is desirable to use a method that can control their thickness in units of an atomic layer.

The first charge trap layer 14c-1 is in an amorphous state immediately after it has been formed by, for example, CVD, ALD, or PVD techniques. After this, heat treatment (or annealing) is performed, thereby crystallizing the first charge trap layer 14c-1 in an amorphous state.

Figure 13:
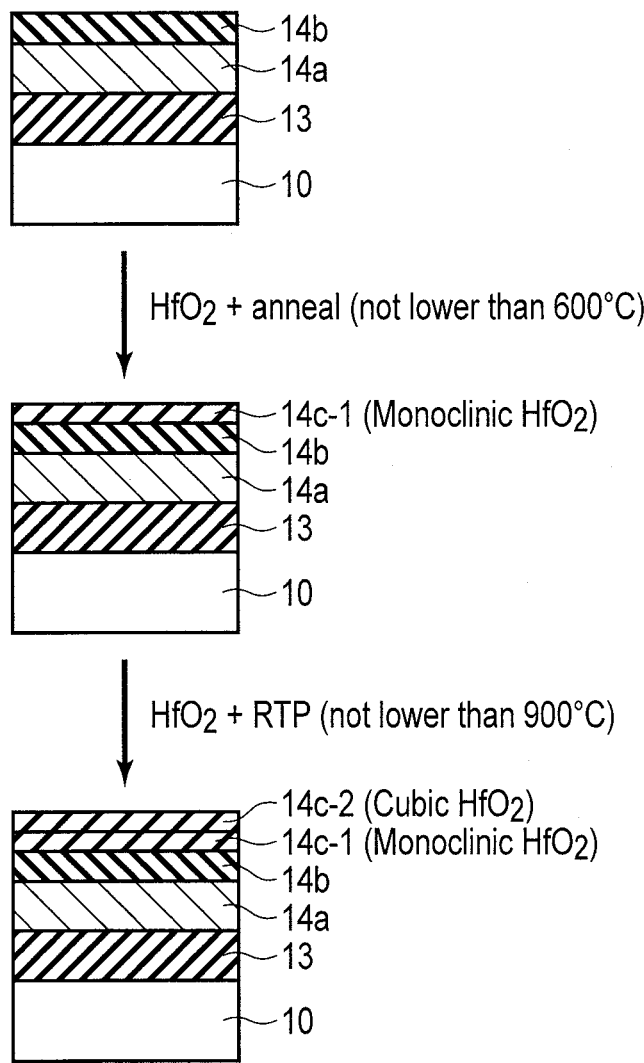
FIG. 13 is a diagram showing a method of forming a charge trap layer with a cubic crystal structure.
Figure 14:
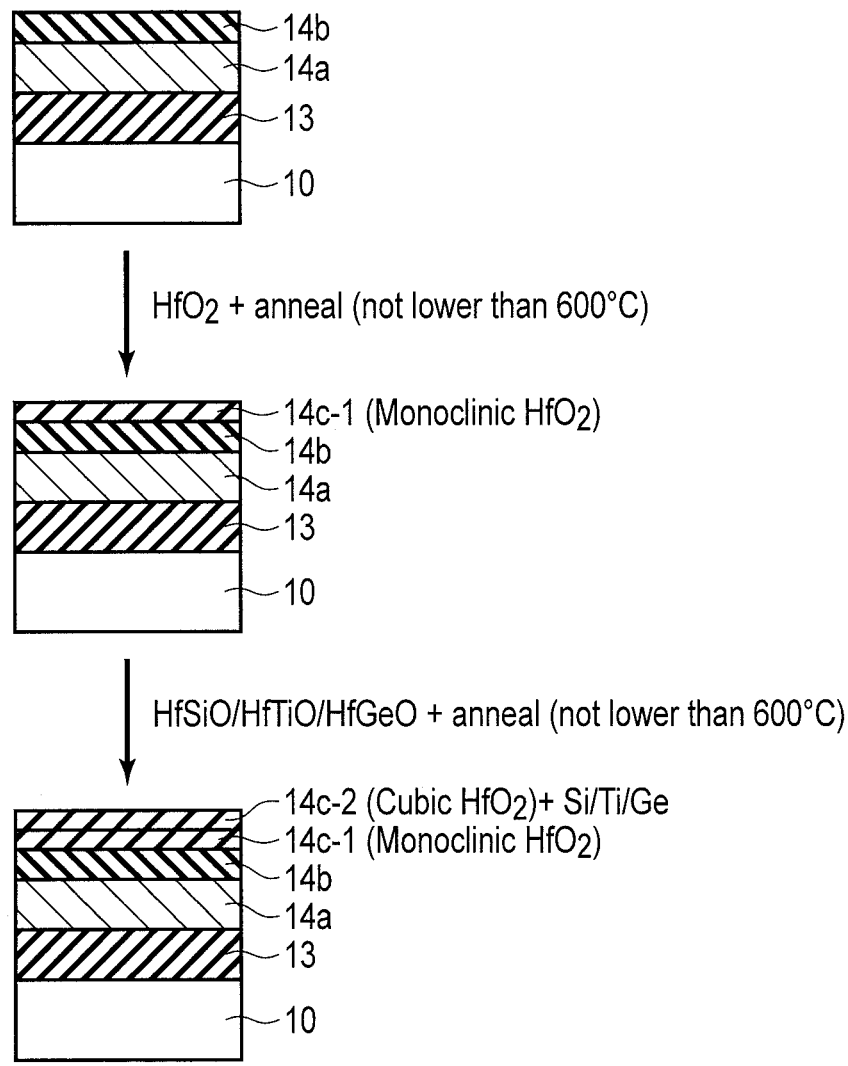
FIG. 14 is a diagram showing a method of forming a charge trap layer with a cubic crystal structure.

For example, as shown in FIGS. 13 and 14, after the first charge trap layer (e.g., $HfO_2$) 14c-1 has been formed on the interface insulating layer 14b, it is annealed at a temperature of not lower than 600° C., with the result that the first charge trap layer 14c-1 changes from the amorphous state into a monoclinic crystal structure.

Thereafter, a second charge trap layer (e.g., $HfO_2$) 14c-2 is formed on the first charge trap layer 14c-1 by, for example, CVD, ALD, or PVD techniques. The second charge trap layer 14c-2 is also in an amorphous state immediately after it has been formed by, for example, CVD, ALD, or PVD techniques.

After this, heat treatment (or annealing) is performed, thereby crystallizing the second charge trap layer 14c-2 in an amorphous state.

Unlike the first charge trap layer 14c-1, the second charge trap layer 14c-2 has to be caused to have a cubic crystal structure.

To cause the second charge trap layer 14c-2 to have a cubic crystal structure, for example, after the second charge trap layer 14c-2 has been formed as shown in FIG. 13, annealing (e.g., RTP: Rapid thermal process) is performed at not lower than 900° C. by high-speed temperature rising and falling at not lower than 1000° C./sec.

When such annealing has been performed, the second charge trap layer 14c-2 changes from the amorphous state into a cubic crystal structure.

In addition, to cause the second charge trap layer 14c-2 to have a cubic crystal structure, for example, an impurity (one selected from a group of Si, Ti, and Ge) is included in the second charge trap layer 14c-2 when the second charge trap layer 14c-2 is formed as shown in FIG. 14.

It is desirable that the concentration of the impurity in the second charge trap layer 14c-2 should be not higher than 10%.

In this case, for example, when annealing has been performed at a temperature of not lower than 600° C., the second charge trap layer 14c-2 changes from the amorphous state into a cubic crystal structure.

Next, as shown in FIG. 15, by a photo engraving process (PEP), a resist pattern 21 is formed on a charge storage layer 14 that includes the floating gate layer 14a, interface insulating layer 14b, the first charge trap layer 14c-1, and second charge trap layer 14c-2.

With the resist pattern 21 as a mask, the charge storage layer 14, gate insulating layer 13, and semiconductor layer 10 are etched by RIE techniques. As a result, element isolation tranches T are made between a plurality of memory cell areas. Each of the memory cell areas formed by the element isolation trenches T is shaped like a fin whose width is W in a first direction, which extends in a second direction, and whose height is H in a third direction.

After this, the resist pattern 21 is removed.

While in the embodiment, the fin-shaped memory cell area has been patterned with the resist pattern 21 as a mask, a hard mask layer may be used as a mask in place of the resist pattern 21.

Next, as shown in FIG. 16, an element isolation insulating layer (e.g., a silicon oxide layer) 11 that fills the element isolation trench T completely is formed. In addition, the element isolation insulating layer 11 is polished by chemical mechanical polishing (CMP) techniques, thereby causing the element isolation insulating layer 11 to remain only in the element isolation trench T.

As a result, an element isolation insulating layer 11 with a shallow trench isolation (STI) structure is formed.

Figure 17:
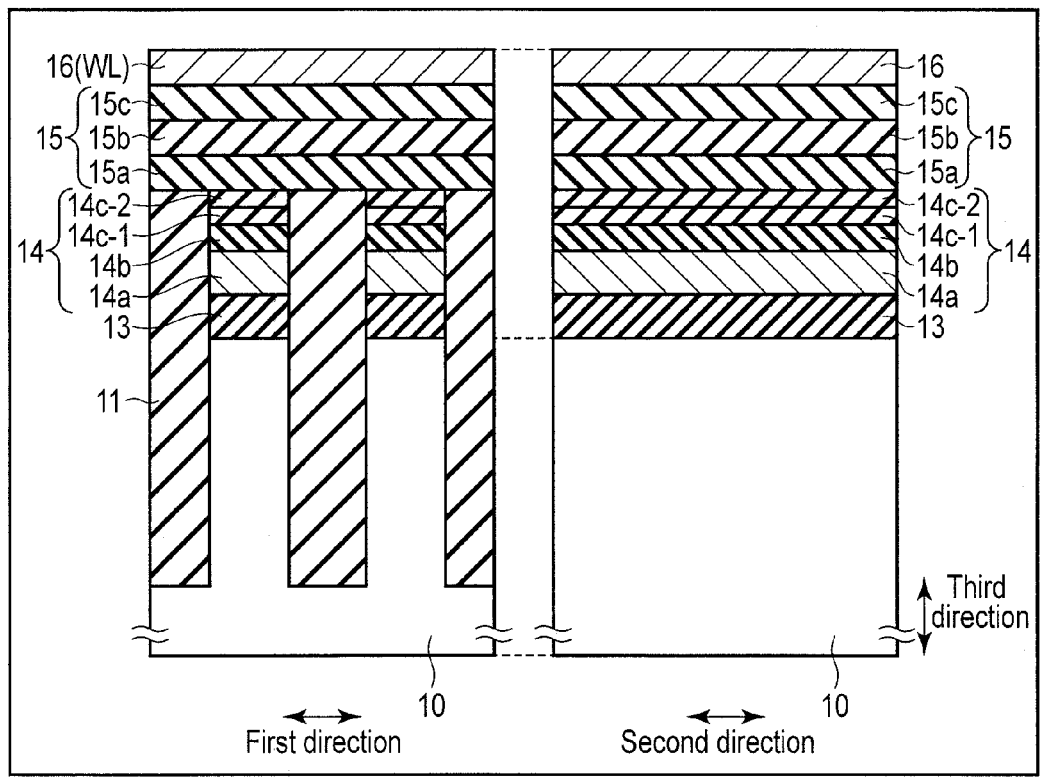
FIG. 17 is a sectional diagram showing the method of manufacturing the memory cell of the embodiment.

Next, as shown in FIG. 17, a block insulating layer (15a, 15b, 15c) 15 is formed on the element isolation insulating layer 11 and charge storage layer 14 by, for example, CVD or ALD techniques. The block insulating layer 15 is formed on a flat base. Specifically, the block insulating layer 15 covers only the top surface of the charge storage layer 14, but does not cover the side surface of the charge storage layer 14. As described above, this structure, which is known as a flat cell structure, is effective in miniaturizing a memory cell, narrowing the width of the memory cell in the first direction.

In addition, a control gate electrode 16 is formed on the block insulating layer 15 by, for example, CVD or ALD techniques.

Next, as shown in FIG. 18, the memory cell is patterned by, for example, PEP or RIE techniques.

For example, with a resist pattern with a line & space pattern extending in the first direction as a mask, the control gate electrode 16, block insulating layer 15, charge storage layer 14, and gate insulating layer 13 are etched sequentially, thereby forming a plurality of memory cells MCs which are isolated from one another in the second direction.

The control gate electrode 16 becomes a word line WL extending in the first direction at this moment.

Lastly, with the control gate electrode 16 of the memory cell MC as a mask, an impurity is implanted into the semiconductor layer 10 by ion implantation, with the result that a source/drain region 12 is formed by self-alignment.

By the above manufacturing processes, the nonvolatile semiconductor memory device of FIGS. 1 to 3 has been completed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   a semiconductor layer;
   a first insulating layer on the semiconductor layer;
   a charge storage layer on the first insulating layer;
   a second insulating layer on the charge storage layer; and
   a control gate electrode on the second insulating layer,
   wherein the charge storage layer includes a floating gate layer on the first insulating layer, an interface insulating layer on the floating gate layer, a first charge trap layer on the interface insulating layer, and a second charge trap layer on the first charge trap layer, and
   a trap level of the second charge trap layer is lower than a trap level of the first charge trap layer.

2. The device of claim 1, wherein the first charge trap layer has a monoclinic crystal structure and the second charge trap layer has a cubic crystal structure.

3. The device of claim 2, wherein the first charge trap layer includes a first material;
   the second charge trap layer includes a second material; and
   the second material is the first material containing impurities.

4. The device of claim 2, wherein each of the first and second charge trap layer comprises $HfO_2$.

5. The device of claim 3, wherein each of a first and second charge trap layer comprises $HfO_2$ and the impurities include one of Si, Ti, and Ge.

6. The device of claim 2, wherein a lower end of a conduction band of the interface insulating layer is higher than a trap level of the first charge trap layer and lower than a lower end of a conduction band of the first charge trap layer.

7. The device of claim 6, wherein the first charge trap layer includes a first material;
   the interface insulating layer includes a second material; and
   the second material is the first material containing alkali metal.

8. The device of claim 7, wherein the alkali metal is Mg.

9. The device of claim 6, wherein the charge trap layer includes a first material;
the interface insulating layer includes a second material; and
the second material is the first material containing a lanthanoid-based constituting.

10. The device of claim 9, wherein the lanthanoid-based material is one of La and Y.

11. The device of claim 1, wherein a side surface of the first insulating layer and a side surface of the charge storage layer are covered with an element isolation insulating layer and the second insulating layer and the control gate electrode are arranged on the charge storage layer and the element isolation insulating layer.

12. The device of claim 1, wherein the second insulating layer includes layers which include materials different from each other respectively.

13. The device of claim 1, wherein the semiconductor layer is a semiconductor substrate.

14. A method of manufacturing the device of claim 2, the method comprising:
forming the first charge trap layer with the monoclinic crystal structure;
forming the second charge trap layer with an amorphous state on the first charge trap layer; and
changing the second charge trap layer to the cubic crystal structure by executing a heat treatment with a rising/falling temperature characteristic of 1000° C./sec or more.

15. The method of claim 14, further comprising:
forming the first charge trap layer with an amorphous state on the interface insulating layer; and
changing the first charge trap layer to the monoclinic crystal structure by executing a heat treatment.

16. The method of claim 15, wherein the interface insulating layer, the first charge trap layer, and the second charge trap layer are deposited in an unit of an atomic layer.

17. A method of manufacturing the device of claim 3, the method comprising:
forming the first charge trap layer with the monoclinic crystal structure;
forming the second charge trap layer with an amorphous state including the impurities on the first charge trap layer; and
changing the second charge trap layer to the cubic crystal structure by executing a heat treatment.

18. The method of claim 17, further comprising:
forming the second charge trap layer with the amorphous state containing the impurities not larger than 10% on the first charge trap layer.

19. The method of claim 17, further comprising:
forming the first charge trap layer with an amorphous state on the interface insulating layer; and
changing the first charge trap layer to the monoclinic crystal structure by executing a heat treatment.

20. The method of claim 19, wherein the interface insulating layer, the first charge trap layer, and the second charge trap layer are deposited in an unit of an atomic layer.

* * * * *